(12) United States Patent
Chen et al.

(10) Patent No.: US 12,197,113 B2
(45) Date of Patent: Jan. 14, 2025

(54) HEAT DISSIPATION SYSTEM COMPRISING A PLURALITY OF LIQUID COLD PLATES AND PROJECTION DEVICE

(71) Applicant: Coretronic Corporation, Hsin-Chu (TW)

(72) Inventors: Jing-Wei Chen, Hsin-Chu (TW); Jhih-Tong Chen, Hsin-Chu (TW); Jia-Hong Dai, Hsin-Chu (TW); Kai-Lun Hou, Hsin-Chu (TW); Te-Ying Tsai, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 17/226,095

(22) Filed: Apr. 9, 2021

(65) Prior Publication Data
US 2021/0373421 A1 Dec. 2, 2021

(30) Foreign Application Priority Data

May 29, 2020 (CN) .......................... 202010472850.7

(51) Int. Cl.
*G03B 21/16* (2006.01)
*H04N 9/31* (2006.01)
*H05K 7/20* (2006.01)

(52) U.S. Cl.
CPC ........... *G03B 21/16* (2013.01); *H04N 9/3144* (2013.01); *H05K 7/20254* (2013.01); *H05K 7/20272* (2013.01)

(58) Field of Classification Search
CPC .............................. G03B 21/16; H04N 9/3144
See application file for complete search history.

(56) References Cited

U.S. PATENT DOCUMENTS

| | | | | |
|---|---|---|---|---|
| 7,309,145 B2 * | 12/2007 | Nagata | .................... | F21V 29/70 |
| | | | | 362/373 |
| 9,664,987 B2 * | 5/2017 | Nomoto | .................. | G03B 21/16 |
| 10,108,075 B2 * | 10/2018 | Nomoto | .................. | G03B 21/16 |
| 2005/0168990 A1 * | 8/2005 | Nagata | .................... | G03B 21/16 |
| | | | | 362/294 |

(Continued)

FOREIGN PATENT DOCUMENTS

| CN | 101063797 | 10/2007 |
|---|---|---|
| CN | 101546105 | 9/2009 |

(Continued)

OTHER PUBLICATIONS

"Office Action of China Counterpart Application", issued on May 24, 2022, p. 1-p. 10.

*Primary Examiner* — Bao-Luan Q Le
(74) *Attorney, Agent, or Firm* — JCIPRNET

(57) ABSTRACT

The invention provides a heat dissipation system and a projection device including the same. The heat dissipation system includes a case, a plurality of liquid cold plates, a first radiator and a second radiator. The case includes a main air inlet and an air outlet. The liquid cold plates are disposed in the case. The first radiator is disposed in the case and beside the main air inlet. The second radiator is disposed in the case and beside the air outlet. The liquid cold plates, the first radiator and the second radiator are connected with one another. The invention has a good heat radiating effect.

12 Claims, 6 Drawing Sheets

(56) References Cited

U.S. PATENT DOCUMENTS

| | | | |
|---|---|---|---|
| 2005/0201107 A1* | 9/2005 | Seki | H04N 9/3144 362/373 |
| 2007/0165190 A1* | 7/2007 | Takagi | G03B 21/145 257/E23.098 |
| 2007/0247592 A1* | 10/2007 | Lin | H04N 9/3144 353/54 |
| 2009/0237619 A1* | 9/2009 | Yanagisawa | F25B 21/02 165/104.31 |
| 2009/0266098 A1* | 10/2009 | Nishijima | G03B 21/16 62/513 |
| 2012/0300179 A1* | 11/2012 | Masuda | G03B 21/145 362/249.02 |
| 2013/0070453 A1* | 3/2013 | Chiba | G03B 21/16 362/231 |
| 2016/0142688 A1* | 5/2016 | Nomoto | H04N 9/3144 353/54 |
| 2016/0301902 A1* | 10/2016 | Nakamura | F25B 21/02 |
| 2018/0081262 A1* | 3/2018 | Nakamura | F25D 17/06 |
| 2018/0267393 A1* | 9/2018 | Nomoto | F25B 21/02 |
| 2019/0116343 A1* | 4/2019 | Nakamura | H04N 9/3164 |
| 2019/0121225 A1* | 4/2019 | Suzuki | F21V 29/52 |
| 2019/0129237 A1* | 5/2019 | Nishi | G03B 21/16 |
| 2020/0103733 A1* | 4/2020 | Yoshiba | G02F 1/1333 |

FOREIGN PATENT DOCUMENTS

| | | |
|---|---|---|
| CN | 106814525 | 6/2017 |
| CN | 208255608 | 12/2018 |
| CN | 208506475 | 2/2019 |
| CN | 109588002 | 4/2019 |
| JP | 2006139245 | 6/2006 |
| TW | 200725156 | 7/2007 |
| TW | 200850137 | 12/2008 |

* cited by examiner

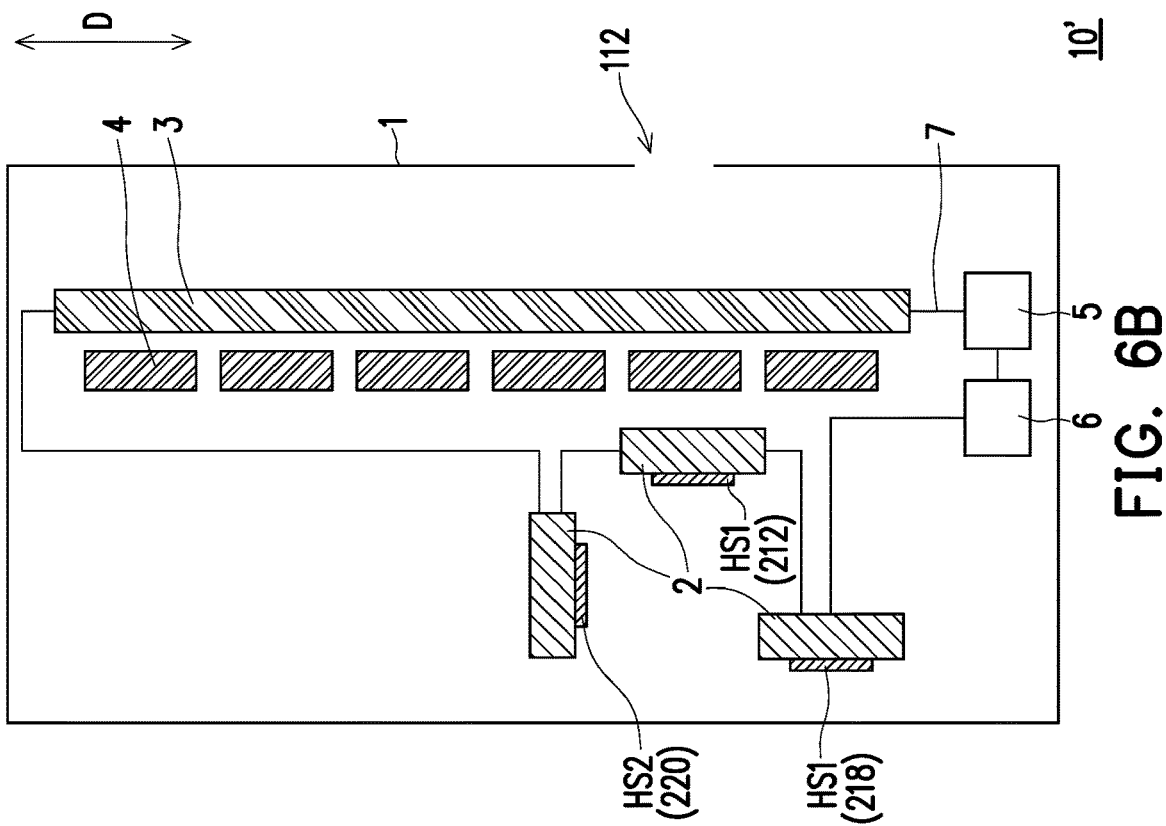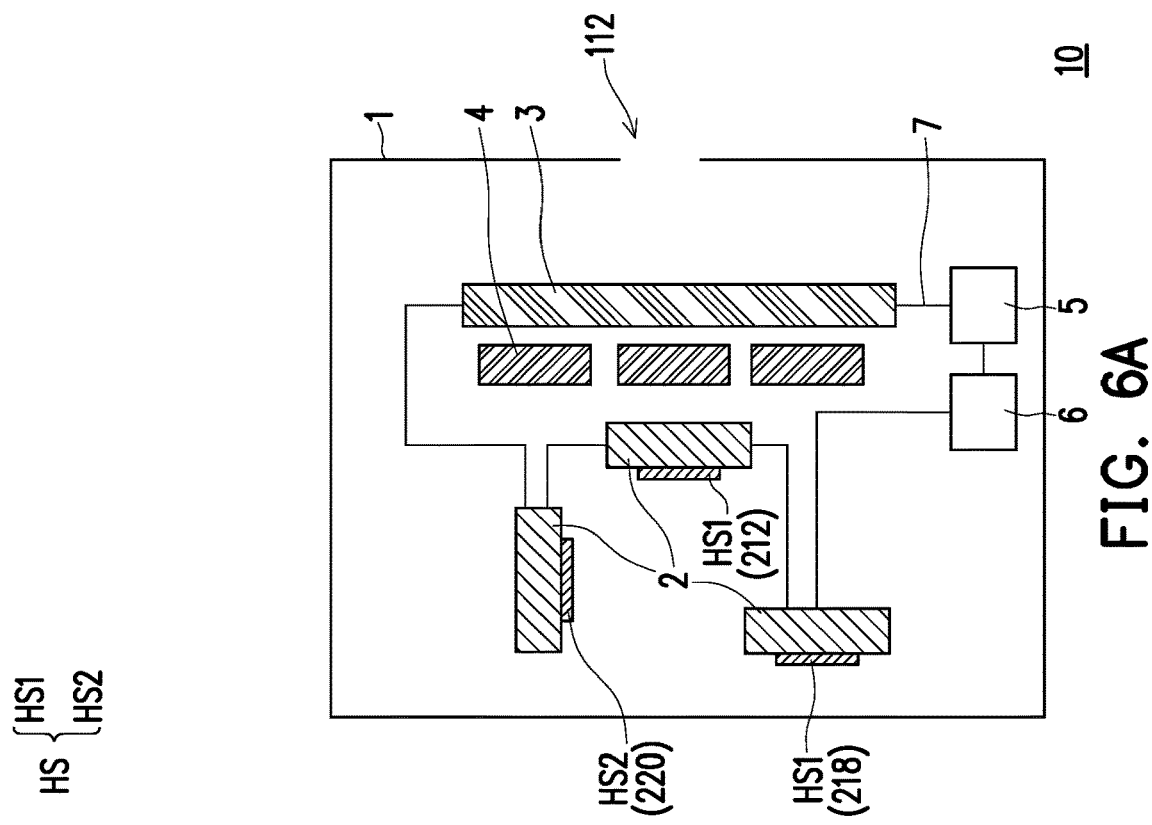

HEAT DISSIPATION SYSTEM COMPRISING A PLURALITY OF LIQUID COLD PLATES AND PROJECTION DEVICE

CROSS-REFERENCE TO RELATED APPLICATION

This application claims the priority benefit of China application serial no. 202010472850.7, filed on May 29, 2020. The entirety of the above-mentioned patent application is hereby incorporated by reference herein and made a part of this specification.

BACKGROUND

Technical Field

The disclosure relates to a heat dissipation system and a projection device, in particular to a heat dissipation system and a projection device including liquid cold plates and radiators.

Description of Related Art

With the development of science and technology, projectors are more and more widely used in life. For example, projectors may be used indoors, outdoors, at cinemas, and at other different places. In the projector market, high-brightness projectors have become a trend. The projectors may include a high-power light-emitting element to achieve high brightness, but high brightness is also accompanied by a large amount of heat energy. On the other hand, because the core element, such as a light valve, may receive a light beam from the high-power light-emitting element, a large amount of heat energy may seriously affect the efficiency and reliability of the light valve. Therefore, in the field of projectors, heat radiation is a very important issue.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention were acknowledged by a person of ordinary skill in the art.

SUMMARY

The invention provides a heat dissipation system and a projection device adopting the heat dissipation system, which have a good heat radiating effect.

Other objectives and advantages of the invention may be more comprehensible from technical features disclosed in the invention.

An embodiment of the invention provides a heat dissipation system. The heat dissipation system includes a case, a plurality of liquid cold plates, at least one first radiator and at least one second radiator. The case includes a main air inlet and an air outlet. The liquid cold plates are disposed in the case. The at least one first radiator is disposed in the case and beside or corresponds to the position of the main air inlet. The second radiator is disposed in the case and beside or corresponds to the position of the air outlet. The liquid cold plates, the at least one first radiator and the second radiator are connected with one another.

An embodiment of the invention provides a projection device. The projection device includes a plurality of heat sources and the heat dissipation system. The heat dissipation system includes a plurality of liquid cold plates. The heat sources are thermally coupled to the liquid cold plates.

Based on the above, in the heat dissipation system or the projection device provided by the embodiments of the invention, the first radiator and the second radiator may be respectively disposed beside or corresponds to the main air inlet and the air outlet of the case. Since the temperature at the main air inlet is lower and the air volume at the air outlet is large, the first radiator and the second radiator can effectively discharge the heat generated by the heat sources, so the heat radiating effect is good.

Other objectives, features and advantages of the invention will be further understood from the further technological features disclosed by the embodiments of the invention wherein there are shown and described exemplary embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 6A and FIG. 6B are schematic structural diagrams of heat dissipation systems according to comparative embodiments.

DESCRIPTION OF THE EMBODIMENTS

In the following detailed description of the exemplary embodiments, reference is made to the accompanying drawings which form a part hereof, and in which are shown by way of illustration specific embodiments in which the invention may be practiced. In this regard, directional terminology, such as "top", "bottom", "front", "back" etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including", "comprising" or "having" and variations thereof herein is meant to encompass the items listed thereafter and equivalents thereof as well as additional items. Unless limited otherwise, the terms "connected", "coupled" and "mounted" and variations thereof herein are used broadly and encompass direct and indirect connections, couplings, and mountings. Similarly, the terms "facing" "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
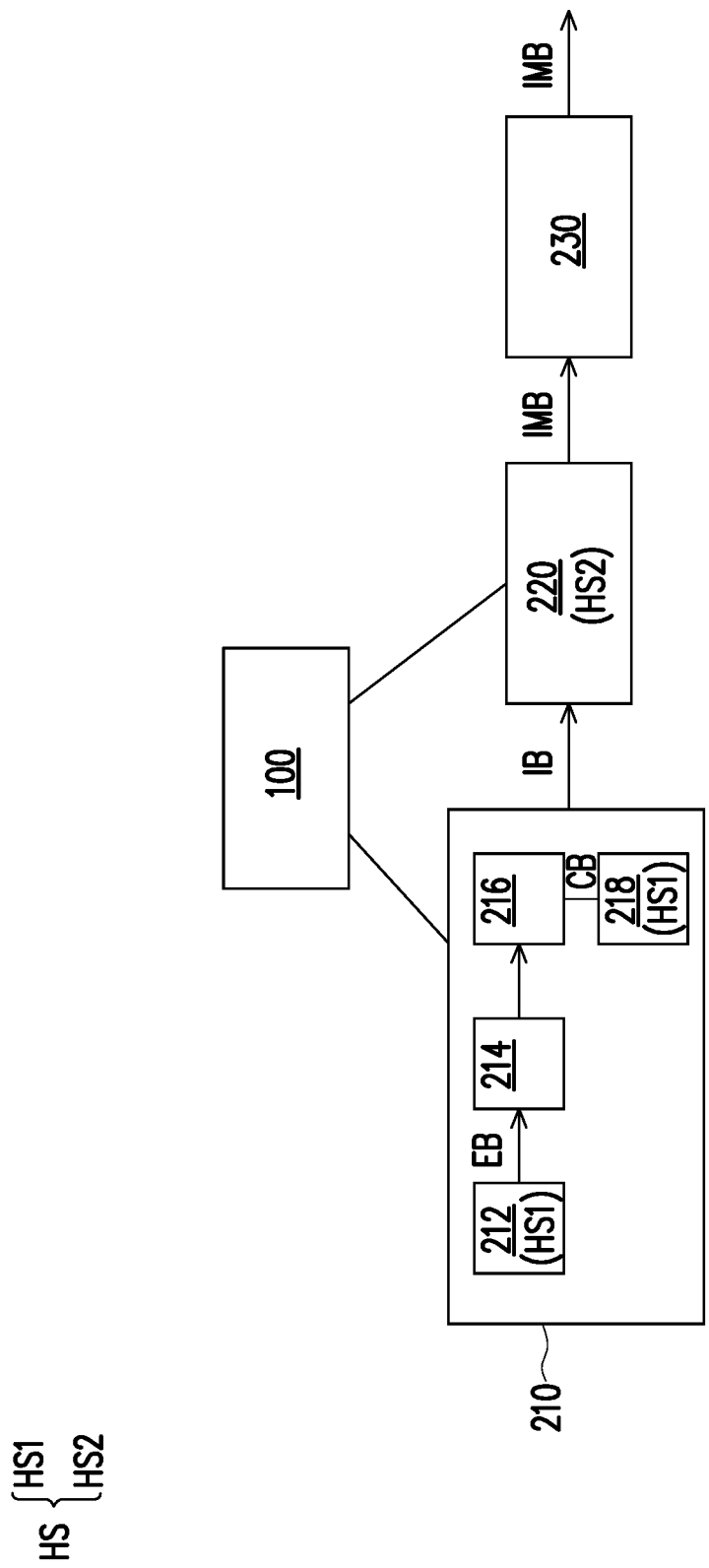
FIG. 1 is a schematic diagram of a projection device according to an embodiment of the invention.

FIG. 1 is a schematic diagram of a projection device according to an embodiment of the invention. Referring to FIG. 1, the projection device 200 includes an illumination system 210, a light valve 220, a heat dissipation system 100 and a projection lens 230. The illumination system 210 is configured to provide an illumination beam IB, which may include elements such as an excitation light source 212, a fluorescent color wheel 214, a filter color wheel 216 and a complementary light source 218. In some embodiments, the illumination system 210 may include an optical element or a combination of optical elements having a light-emitting function. For example, the illumination system 210 may include a combination of a light-emitting element (for example, laser diode or light-emitting diode), a reflector and a lens. However, the invention is not limited thereto. In the present embodiment, the light-emitting element is, for example, the excitation light source 212 configured to emit an excitation beam EB, and the excitation beam EB is, for example, blue light. For example, the excitation light source 212 is a blue laser diode. In other embodiments, the complementary light source 218 is configured to emit a complementary beam CB, and the complementary beam CB is, for example, red light. For example, the complementary light source 218 is a red laser diode.

In the present embodiment, the fluorescent color wheel 214 and the filter color wheel 216 can form needed different color light from the excitation beam EB in different time intervals. The fluorescent color wheel 214 is provided with a fluorescent region and a light transmitting region (or a reflecting region), and the filter color wheel 216 may be provided with a red light filter, a green light filter and a light transmitting region (which may be doped with diffusing particles). For example, in the first time interval, the excitation beam EB is transmitted to the fluorescent region of the fluorescent color wheel 214, fluorescent materials in the fluorescent region are excited to emit a yellow light beam, and the yellow light beam may then be transmitted to the red light filter or the green light filter of the filter color wheel 216 to output the red light beam or the green light beam. Further, the complementary light source 218 may also emit red light to enhance the intensity of red light. In the second time interval, the excitation beam EB may be transmitted to the light transmitting region (or reflecting region) of the fluorescent color wheel 214, and further be transmitted to the light transmitting region of the filter color wheel 216 to output blue light after penetrated (or reflected) by the light transmitting region (or reflecting region) of the fluorescent color wheel. Therefore, the illumination system 210 may sequentially provide beams of different colors at different times to form the illumination beam IB.

In some embodiments, the light valve 220 may include, but is not limited to, a spatial light modulator such as a digital micro-mirror device (DMD), a liquid-crystal-on-silicon panel (LCOS Panel), or a liquid crystal panel (LCD). In the present embodiment, the light valve 220 may be configured to convert the illumination beam IB into an image beam IMB.

In some embodiments, the projection lens 230 may include a combination of a plurality of optical lenses having the same or different diopters. For example, the optical lenses may include non-planar lenses such as biconcave lenses, biconvex lenses, concave-convex lenses, convex-concave lenses, plano-convex lenses and plano-concave lenses, or may include planar lenses. The type and variety of the projection lens 230 are not limited in the invention.

In the above embodiment, the heat dissipation system 100 is configured to radiate the heat generated by heat sources HS of the projection device 200. For example, the heat sources HS may include elements that generate heat during operation. In the projection device 200, for example, the excitation light source 212 and the complementary light source 218 may generate heat in the illumination process. Further, the fluorescent color wheel 214 and the filter color wheel 216 may also generate heat in the process of being irradiated by the excitation beam EB. Further, the light valve 220 may also generate heat in the process of converting the illumination beam IB to the image beam IMB. Therefore, the excitation light source 212, the complementary light source 218, the fluorescent color wheel 214, the filter color wheel 216 and the light valve 220 may be used as the heat sources HS separately or in combination, but the invention is not limited thereto.

Specifically, the heat sources HS may include a first heat source HS1 and a second heat source HS2 according to different working temperatures. In general, the working temperature refers to a temperature is produced by different elements to achieve pre-set working efficiency. In the above embodiment, the first heat source HS1 includes, for example, the excitation light source 212 and the complementary light source 218, and the working temperature of the complementary light source 218 may be less than the working temperature of the excitation light source 212. Further, the second heat source HS2 includes, for example, the light valve 220, and the working temperature of the excitation light source 212 may be less than the working temperature of the light valve 220.

Figure 2:
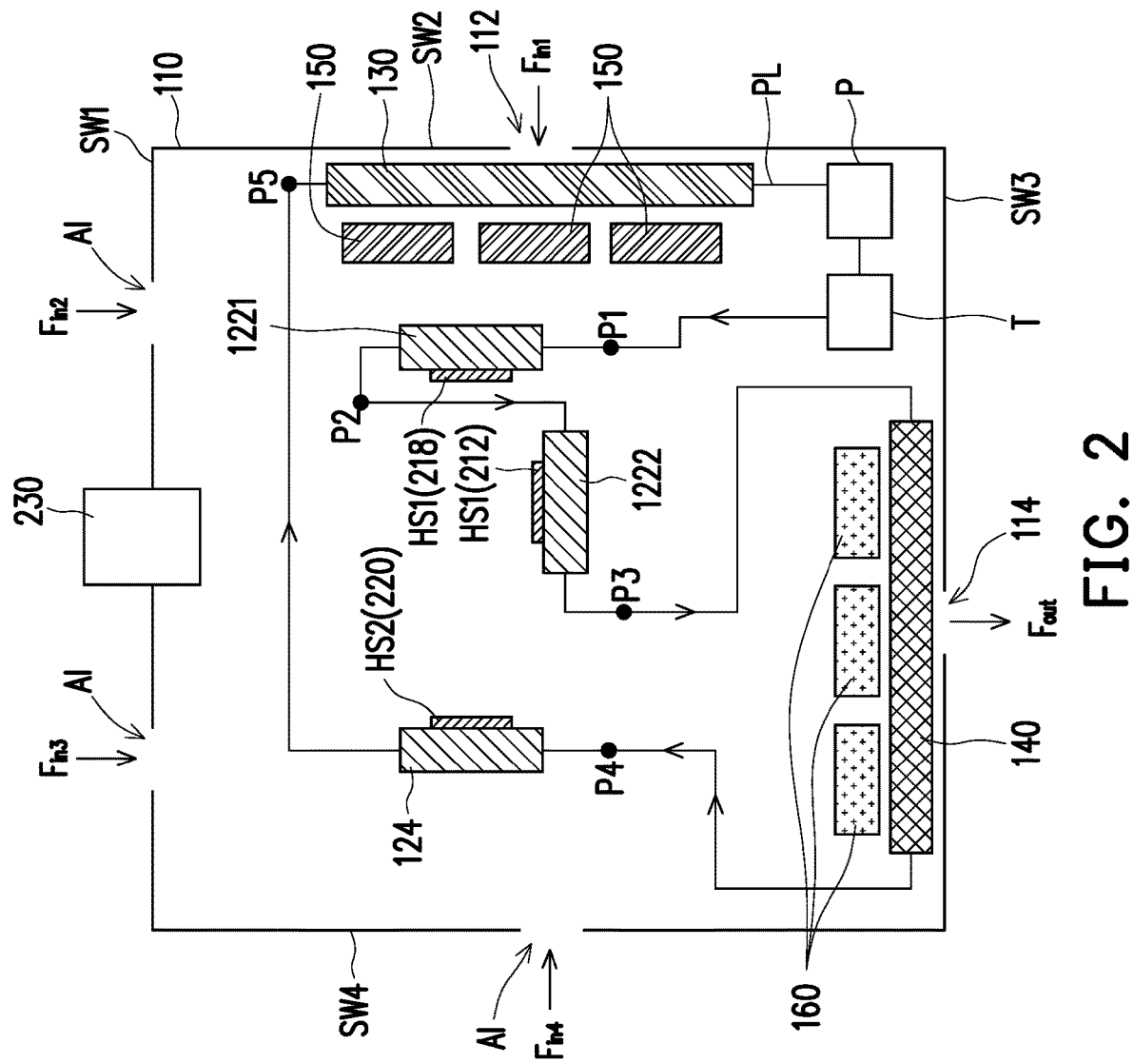
FIG. 2 is a schematic structural diagram of a heat dissipation system according to an embodiment of the invention.

FIG. 2 is a schematic structural diagram of a heat dissipation system according to an embodiment of the invention. Referring to FIG. 2, a heat dissipation system 100 includes a case 110, a plurality of liquid cold plates 120, at least one first radiator 130, and a second radiator 140.

In some embodiments, the case 110 is configured to protect elements inside the projection device 200. Specifically, the case 110 may include first to fourth sidewalls SW1 to SW4 are connected end to end. The first sidewall SW1 is disposed opposite to the third sidewall SW3, and the second sidewall SW2 is disposed opposite to the fourth sidewall SW4. Further, the projection lens 230 may be disposed at the first sidewall SW1. In this case, the first sidewall SW1 may be called as a front cover of the case 110. Correspondingly, the third sidewall SW3 may be called as a back cover of the case 110. However, this is only used to describe the distance, not to limit the invention.

In the present embodiment, the case 110 includes air inlets and an air outlet. For example, as shown in FIG. 2, the case 110 includes a main air inlet 112, three air inlets AI and an air outlet 114. The main air inlet 112 and the air inlets AI can allow an air flow to enter the case 110, and the air outlet 114 can allow the air flow to leave the case 110. In the present embodiment, the main air inlet 112, the air inlets AI and the air outlet 114 are openings disposed on the sidewalls of the case 110, the main air inlet 112 is disposed on the second sidewall SW2, two air inlets AI are disposed on the first sidewall SW1, one air inlet AI is disposed in the fourth sidewall SW4, and the air outlet 114 is disposed in the third sidewall SW3. The main air inlet 112 is defined as, for example, an opening that allows the external air flow to be transmitted to the first radiator. It should be noted that those skilled in the art can change the number and position of the air inlet/air outlet according to the needs, and the invention is not limited thereto. In other embodiments, the number of the main air inlet 112 and the air inlet AI may be, for example, five.

In the present embodiment, the first radiator 130 and the second radiator 140 may be disposed in the case 110, and may be respectively disposed beside or corresponds to the main air inlet 112 and the air outlet 114. For example, the first radiator 130 may be disposed beside or corresponds to the main air inlet 112, and the second radiator 140 may be disposed beside or corresponds to the air outlet 114. In some embodiments, the first radiator 130 and/or the second radiator 140 may include, for example, heat radiating plates or heat radiating fins. In the present embodiment, the number of the first radiator 130 is one, and the number of the second radiator 140 is one, but the invention is not limited thereto.

In some embodiments, the liquid cold plates 120 may include an internal flow channel and have a high heat transfer coefficient. Materials of the liquid cold plates 120 include, for example, metals, but are not limited thereto. In the present embodiment, a plurality of, such as three, liquid cold plates 120 are disposed, and the liquid cold plates 120 may be thermally coupled to, for example, in thermal contact (transfer) with, at least a part of at least one heat source HS. Corresponding to a first heat source HS1 and a second heat source HS2, the liquid cold plates 120 may include a first liquid cold plate 122 and a second liquid cold plate 124. The first heat source HS1 (for example, the excitation light source 212 and complementary light source 218) is thermally coupled to the first liquid cold plate 122, and the second heat source HS2 (for example, light valve 220) is thermally coupled to the second liquid cold plate 124. More specifically, the first liquid cold plate 122 coupled to the excitation light source 212 is marked as 1222, and the first liquid cold plate 122 thermally coupled to the complementary light source 218 is marked as 1221. In the present embodiment, the plurality of liquid cold plates 120 may be disposed in the case 110, and the plurality of liquid cold plates 120 are connected with the first radiator 130 and the second radiator 140. It should be noted that those skilled in the art can change the material, position and number of the liquid cold plate 120 according to the needs, and the invention is not limited thereto.

Referring to FIG. 2 again, the heat dissipation system 100 may further include first fans 150, second fans 160, at least one pipeline PL, a pump P, a storage tank T, and a cooling fluid. The liquid cold plates 120, the first radiator 130 and the second radiator 140 are connected with one another through the pipeline PL, and the cooling fluid flows in the pipeline PL and the above elements.

In some embodiments, the first fans 150 and the second fans 160 may provide air flows. In the present embodiment, the number of the first fan 150 and the second fan 160 may be respectively three. For example, three first fans 150 are disposed to correspond to the position of the first radiator 130, and three second fans 160 are disposed corresponding to the position of the second radiator 140. In detail, the first fans 150 are disposed on one side of the first radiator 130, and the second fans 160 are disposed on one side of the second radiator 140. In this configuration, the first fans 150 and the second fans 160 are respectively configured to provide air flows to radiate the heat generated by the first radiator 130 and the second radiator 140. In other embodiments not shown, the number of the first fan 150 and the second fan 160 may be one, two or more than three, and those skilled in the art can correspondingly change the number or position of the first fans 150 and the second fans 160 according to the needs. However, the invention is not limited thereto.

In some embodiments, the pump P is connected to the pipeline PL to draw the cooling fluid (not shown) to flow in the pipeline. The pump P includes a mechanism that works on the fluid to move it. In some embodiments, the storage tank T is connected to the pipeline PL and may be configured to store the cooling fluid (not shown). Further, as shown in FIG. 2, in a flow path of the cooling fluid, the pump P is disposed between the first radiator 130 and the second radiator 140, and the storage tank T is disposed between the pump P and the second radiator 140. The cooling fluid may circulate inside the pipeline PL. The cooling fluid may be, for example, water, but is not limited thereto.

In some embodiments, referring to FIG. 2, in the flow path of the cooling fluid, the first liquid cold plates 122 (for example, the first liquid cold plates 1221, 1222) may be connected between the first radiator 130 and the second radiator 140 through the pipeline PL. The second liquid cold plate 124 is disposed at the downstream pipeline PL of the second radiator 140 through the pipeline PL. Further, the pump P may be disposed at the pipeline PL between the first radiator 130 and the second radiator 140, and the storage tank T may be disposed at the pipeline PL between the pump P and the second radiator 140. In the present embodiment, the pipeline PL is a closed pipeline, and is connected to the liquid cold plates 120 (for example, the first liquid cold plates 1221, 1222 and the second liquid cold plate 124), the first radiator 130, the second radiator 140, the pump P and the storage tank T, such that the cooling fluid can circulate between these elements.

In some embodiments, for illustration, five positions along the pipeline PL may be marked as P1 to P5 respectively, and the temperature is T1 to T5 respectively.

Referring to FIG. 2, the cooling fluid stored in the storage tank T can flow to the position P1 through the pipeline PL and then to the first liquid cold plate 1221 under the drawing effect of the pump P. The heat emitted by the first heat source HS1 (for example, the complementary light source 218) is transferred through the first liquid cold plate 1221 to the cooling fluid flowing therethrough, so as to achieve the effect of radiating the heat generated by the first heat source HS1. Correspondingly, the temperature of the cooling fluid in the first liquid cold plate 1221 may be increased. Therefore, the temperature T2 of the cooling fluid at the position P2 at the downstream of the first liquid cold plate 1221 is greater than the temperature T1 at the position P1. In the present embodiment, the liquid cold plates can be regarded as a heat exchanger between the cooling fluid and the heat source HS.

Further, under the drawing effect of the pump P, the cooling fluid flows into the first liquid cold plate 1222, and the effect of radiating the heat generated by the first heat source HS1 (for example, the excitation light source 212) is similar to that of the first liquid cold plate 1221, which will not be repeated here. Similarly, the temperature T3 of the cooling fluid at the position P3 at the downstream of the first liquid cold plate 1222 is greater than the temperature T2 at the position P2. Further, the cooling fluid flows into the second radiator 140. At the second radiator 140, since the second fan 160 can provide the air flow to the second radiator 140, the second radiator 140 can radiate heat. Correspondingly, the temperature T4 of the cooling fluid at the position P4 at the downstream of the second radiator 140 may be less than the temperature T3 at the position P3.

Referring to FIG. 2 again, the cooling fluid then flows into the second liquid cold plate 124. The effect of radiating the heat generated by the second heat source HS2 (for example, the light valve 220) is similar to that of the first liquid cold plate 122, which will not be repeated here. In some embodiments, a first working temperature of the first heat source HS1 may be less than a second working temperature of the second heat source HS2. Before the cooling fluid flows into the first liquid cold plate 1221, the temperature at the position P1 is T1, and before the cooling fluid flows into the second liquid cold plate 124, the temperature at the position P4 is T4, and T1≤T4. In the present embodiment, the temperature T5 of the cooling fluid at the position P5 may be the highest.

Further, after flowing through the second liquid cold plate 124, the cooling fluid can continue to flow into the first radiator 130. Further, through the first fan 150, the cooling fluid exchanges heat in the first radiator 130 to transfer the heat energy of the first radiator 130 to a space in the case 110. Since the first radiator 130 is adjacent to the main air inlet 112, after the cooling fluid flows through the first radiator 130, the temperature T1 of the cooling fluid at the position P1 at the downstream of the first radiator 130 may be the lowest. In this way, the cooling fluid flows to the pump P, thus forming a heat radiating cycle.

In the embodiment shown in FIG. 2, in the projection process of the projection device 200, the air flow will enter the case 110 from the main air inlet 112 and the air inlets AI, exchange heat in the case 110, and leave the case 110 through the air outlet 114. The sum of the air inflow $F_{in1}$, $F_{in2}$, $F_{in3}$ and $F_{in4}$ of the main air inlet 112 and the plurality of air inlets AI is roughly equal to the air outflow $F_{out}$ of the air outlet 114, that is, $F_{in1}+F_{in2}+F_{in3}+F_{in4}=F_{out}$. Since the air outflow $F_{out}$ of the air outlet 114 is large, the heat at the second radiator 140 can be quickly carried away from the heat dissipation system 100.

Figure 3:
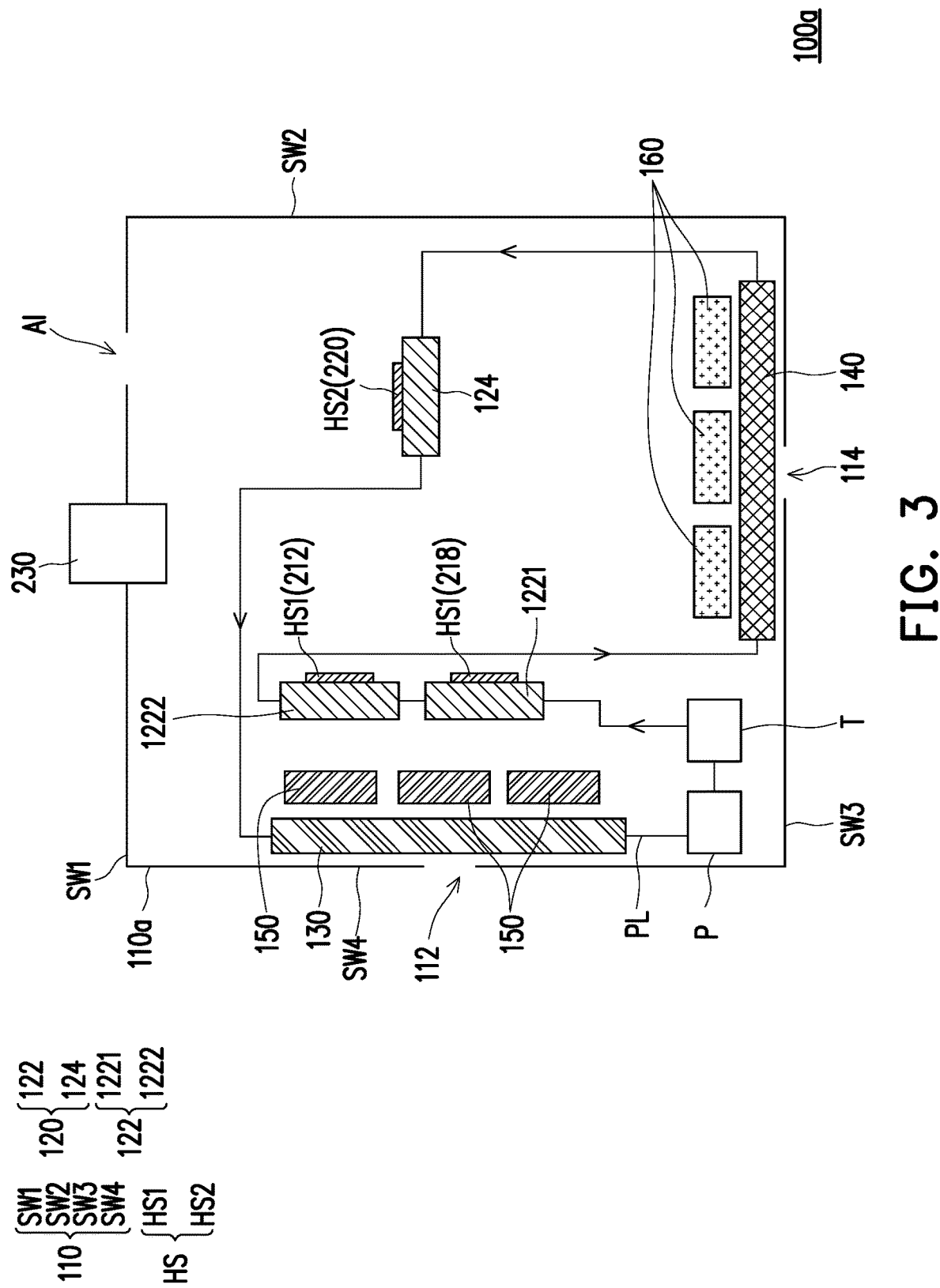
FIG. 3 to FIG. 5 are schematic structural diagrams of heat dissipation systems according to different embodiments of the invention.
Figure 4:
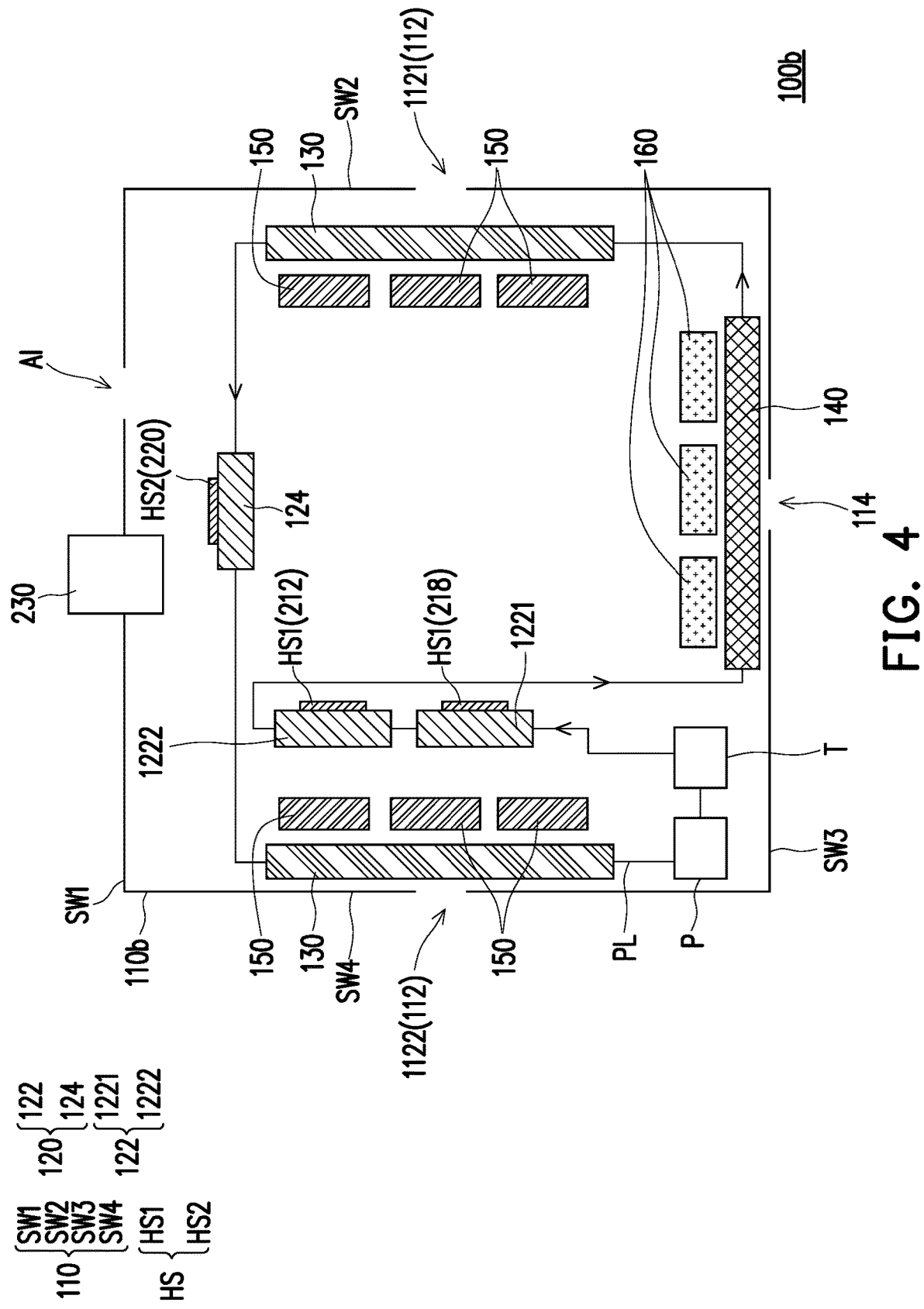
Figure 5:
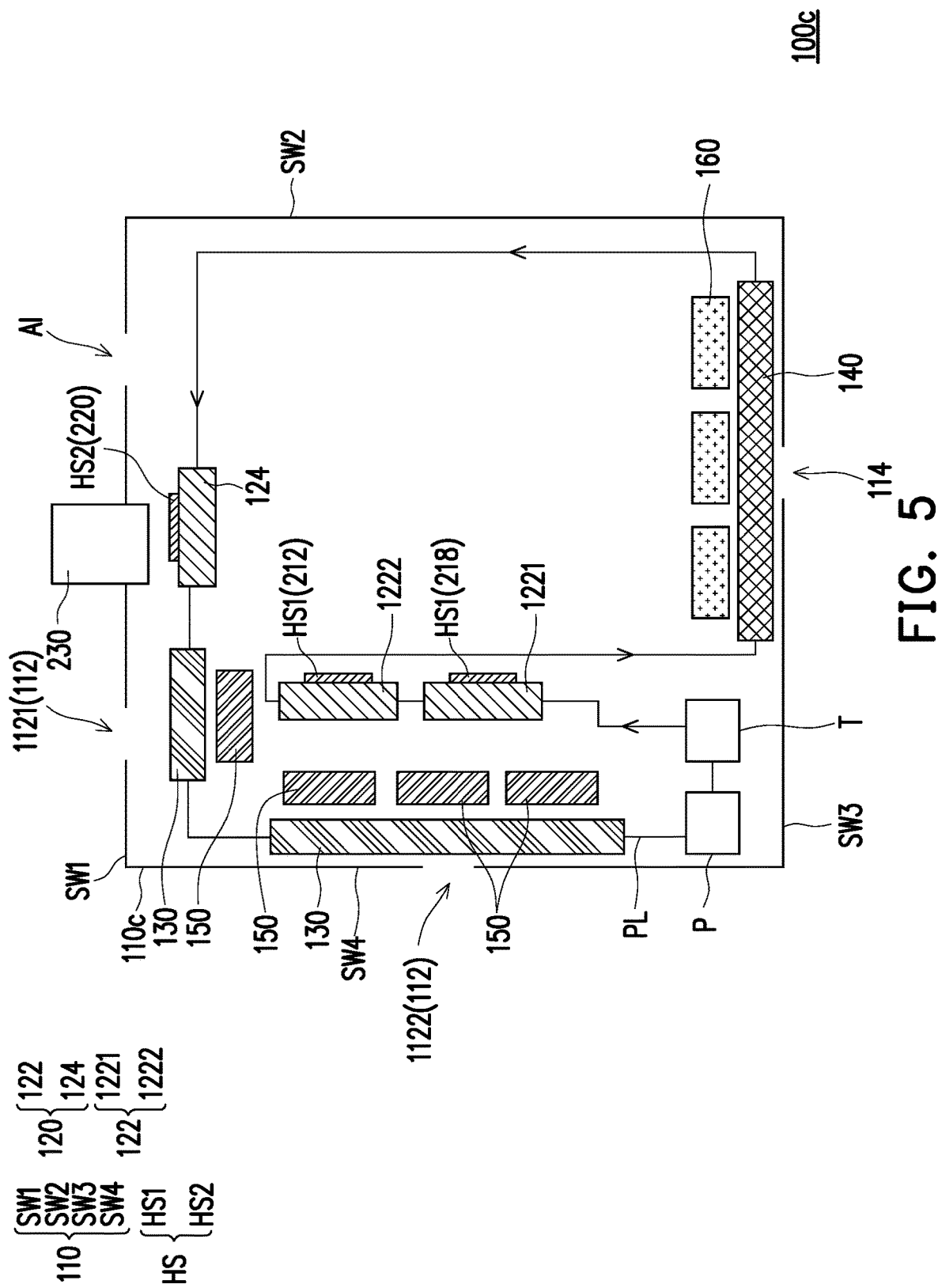

FIG. 3 to FIG. 5 are schematic structural diagrams of heat dissipation systems according to different embodiments of the invention. Referring to FIG. 3, a heat dissipation system 100a in FIG. 3 is similar to the heat dissipation system 100 in FIG. 1. The main difference is that in a case 110a, a main air inlet 112 is disposed in a fourth sidewall SW4, and one air inlet AI is disposed in a first sidewall SW1. In the present embodiment, no air inlet is disposed in a second sidewall SW2. In other embodiments, more air inlets or no air inlet is disposed in the first sidewall, and one or more air inlets may be disposed in the second sidewall. However, the invention is not limited thereto.

Referring to FIG. 4, a heat dissipation system 100b in FIG. 4 is similar to the heat dissipation system 100 in FIG. 1. The main difference is that in a case 110b, an air inlet AI, a first main air inlet 1121 (112) and a second main air inlet 1122 (112) are respectively disposed in a first sidewall SW1, a second sidewall SW2 and a fourth sidewall SW4. Corresponding to the first main air inlet 1121 (112) and the second main air inlet 1122 (112), two first radiators 130 are respectively disposed. In the present embodiment, after leaving the first liquid cold plate 1222, the cooling fluid flows to the second radiator 140 and the other first radiator 130 for heat exchange, such that the heat dissipation system 100b according to the present embodiment can meet higher heat radiating requirements.

Referring to FIG. 5, a heat dissipation system 100c in FIG. 5 is similar to the heat dissipation system 100 in FIG. 4. The main difference is that in a case 110c, a first main air inlet 1121 (112) is disposed in a first sidewall SW1, that is, it is disposed on the same side as the air inlet AI. Correspondingly, the other first radiator 130 is disposed corresponding to the first main air inlet 1121 (112). It is worth mentioning that in the above-mentioned embodiments, at least one first fan 150 may be disposed on one side of each first radiator 13, and at least one second fan 160 may be disposed on one side of the second radiator 140. However, the position and the number of the first fan 150 or the second fan 160 are not limited thereto. In other embodiments not shown, the first fan may be disposed on the other side or both sides of the first radiator 130, or the first fan may be omitted.

In the embodiments shown in FIG. 4 and FIG. 5, two first radiators 130 are disposed, such that the cooling fluid can sequentially exchange heat twice in the two first radiators 130, and thus, the temperature difference between the cooling fluid flowing into the second liquid cold plate 124 and the second heat source HS2 is greater. Therefore, the heat dissipation systems 100b and 100c according to the present embodiment can meet higher heat radiating requirements.

FIG. 6A and FIG. 6B are schematic structural diagrams of heat dissipation systems 10' and 10" according to comparative embodiments (known). Referring to FIG. 6A, a heat dissipation system 10 includes a case 1, a plurality of liquid cold plates 2, a radiator 3, fans 4, a pump 5, a storage tank 6 and a pipeline 7. The case 1 includes an air inlet 112. Starting from the pump 5, the pump 5, the storage tank 6, the plurality of liquid cold plates 2 and the radiator 3 are disposed sequentially along the pipeline 7. The plurality of fans 4 may be disposed beside or corresponds to the radiator 3. A plurality of heat sources HS (for example, the complementary light source 218, the excitation light source 212, the light valve 220) of a projection device may be thermally coupled to these liquid cold plates 2 respectively. The embodiment shown in FIG. 6B is similar to that in FIG. 6A, and the difference is that in FIG. 6B, the volume of the radiator 3 is larger (for example, longer), so as to provide larger heat radiating area, and more fans 4 may be disposed around the radiator 3. In the comparative embodiments, since no radiator is disposed at the pipeline 7 between the liquid cold plates 2, when the cooling fluid flows in the pipeline 7 between the plurality of liquid cold plates 2, the temperature of the cooling fluid will gradually rise from the upstream to the downstream of the pipeline 7. In this case, after the cooling fluid flows through the liquid cold plate of the first heat source HS1, when it flows into the liquid cold plate corresponding to the second heat source HS2, its temperature is high, so it cannot effectively discharge heat for the second heat source HS2 in short time, resulting in poor effect of cooling the second heat source HS2. In the comparative embodiment shown in FIG. 6B, since the heat dissipation system 10' is disposed, the overall space utilization of the case 1 is poor.

Referring back to the heat dissipation system according to the embodiments of the invention, the first radiator 130 and the second radiator 140 are disposed respectively beside or corresponds to the positions of the main air inlet 112 and the air outlet 114 of the case 110. Since the air temperature at the main air inlet 112 is lower and the air volume at the air outlet 114 is large, the cooling fluid can exchange heat more effectively when flowing through the first radiator 130 and the second radiator 140, so as to more effectively carry away the heat. Further, since the second radiator 140 is disposed, before entering the second liquid cold plate 124 to radiate the heat generated by the second heat source HS2, the cooling fluid is cooled at the second radiator 140 through heat radiating, and the heat dissipation system 100 and the projection device 200 can achieve a good heat radiating effect in a small volume.

Based on the above, in the heat dissipation system and the projection device according to the embodiments of the invention, the first radiator and the second radiator are respectively disposed beside or correspond to the main air inlet and air outlet of the case. Since the temperature at the main air inlet is lower and the air volume at the air outlet is large, the first radiator and the second radiator can effectively discharge the heat generated by the heat sources. Therefore, the heat dissipation system and the projection device have a good heat radiating effect.

The foregoing description of the exemplary embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the disclosure" or the like does not necessarily limit the claim scope to a specific embodiment, and the reference to particularly exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the present disclosure is intended to be dedicated to the public regardless of whether the element or component is explicitly recited in the following claims.

What is claimed is:

1. A heat dissipation system comprising a case, a plurality of liquid cold plates, at least one first radiator, a second radiator, at least one pipeline and at least one first fan, wherein the case comprises at least one main air inlet and an air outlet, the plurality of liquid cold plates are disposed in the case, the at least one first radiator is disposed in the case and corresponds to the at least one main air inlet, the second radiator is disposed in the case and corresponds to beside the air outlet, and the at least one first fan is disposed at one side of the at least one first radiator, and the at least one first radiator is located between the at least one first fan and the at least one main air inlet, wherein the plurality of liquid cold plates, the at least one first radiator and the second radiator are connected with one another, wherein the plurality of liquid cold plates comprise at least one first liquid cold plate and at least one second liquid cold plate, and wherein the at least one first radiator corresponding to the at least one main air inlet, the at least one first liquid cold plate, the second radiator corresponding to the air outlet and the at least one second liquid cold plate are sequentially connected through the at least one pipeline, and a cooling fluid in the at least one pipeline sequentially flows through the second radiator corresponding to the air outlet, the at least one second liquid cold plate, the at least one first radiator corresponding to the at least one main air inlet and the at least one first liquid cold plate, wherein the at least one first fan is configured to guide the air from the at least one main air inlet to flow through the at least one first radiator, wherein the case further comprises a first sidewall, a second sidewall, a third sidewall and a fourth sidewall connected to each other, wherein the first sidewall is disposed opposite to the third sidewall, and the second sidewall is disposed opposite to the fourth sidewall, wherein the at least one main air inlet is disposed on at least one of the fourth sidewall and the second sidewall, and the at least one first radiator is located adjacent to the at least one main air inlet of the at least one of the fourth sidewall and the second sidewall, wherein the air outlet is disposed on the third sidewall, and the second radiator is disposed adjacent to the air outlet of the third sidewall.

2. The heat dissipation system according to claim 1 further comprising:

a pump is connected to the at least one pipeline and is configured to draw the cooling fluid to flow in the at least one pipeline, wherein the pump is disposed between the at least one first radiator and the second radiator; and a storage tank is connected to the at least one pipeline and is configured to store the cooling fluid, wherein the storage tank is disposed between the pump and the second radiator.

3. The heat dissipation system according to claim 1, further comprising at least one second fan beside the second radiator.

4. The heat dissipation system according to claim 1, wherein the at least one main air inlet is a plurality of main air inlets, the plurality of main air inlets comprise a first main air inlet and a second main air inlet, the first main air inlet is disposed on the second sidewall, the second main air inlet is disposed on the fourth sidewall.

5. The heat dissipation system according to claim 1, wherein the at least one main air inlet is a plurality of main air inlets, and the plurality of main air inlets comprise a first main air inlet and a second main air inlet, the first main air inlet is disposed on the first sidewall, the second main air inlet is disposed on the second sidewall or the fourth sidewall.

6. A projection device comprising a plurality of heat sources and a heat dissipation system, wherein the heat dissipation system comprises a case, a plurality of liquid cold plates, at least one first radiator, at least one second radiator, at least one pipeline and at least one first fan, wherein the case comprises at least one main air inlet and an air outlet, the plurality of liquid cold plates are disposed in the case, wherein the plurality of liquid cold plates are thermally coupled to at least a part of the plurality of heat sources, the at least one first radiator is disposed in the case and corresponds to beside at least one the main air inlet, the second radiator is disposed in the case and corresponds to beside the air outlet, and the at least one first fan is disposed at one side of the at least one first radiator, and the at least one first radiator is located between the at least one first fan and the at least one main air inlet, wherein the plurality of liquid cold plates, the at least one first radiator and the second radiator are connected with one another, wherein the plurality of liquid cold plates comprise at least one first liquid cold plate and at least one second liquid cold plate, and wherein the at least one first radiator corresponding to the at least one main air inlet, the at least one first liquid cold plate, the second radiator corresponding to the air outlet and the at least one second liquid cold plate are sequentially connected through the at least one pipeline, and a cooling fluid in the at least one pipeline sequentially flows through the second radiator corresponding to the air outlet, the at least one second liquid cold plate, the at least one first radiator corresponding to the at least one main air inlet and the at least one first liquid cold plate, wherein the at least one first fan is configured to guide the air from the at least one main air inlet to flow through the at least one first radiator, wherein the case further comprises a first sidewall, a second sidewall, a third sidewall and a fourth sidewall connected to each other, wherein the first sidewall is disposed opposite to the third sidewall, and the second sidewall is disposed opposite to the fourth sidewall, wherein the at least one main air inlet is disposed on at least one of the fourth sidewall and the second sidewall, and the at least one first radiator is located adjacent to the at least one main air inlet of the at least one of the fourth sidewall and the second sidewall, wherein the air outlet is disposed on the third sidewall, and the second radiator is disposed adjacent to the air outlet of the third sidewall.

7. The projection device according to claim 6, further comprising:

a pump is connected to the at least one pipeline and configured to draw the cooling fluid to flow in the at least one pipeline, wherein the pump is disposed between the at least one first radiator and the second radiator; and a storage tank connected to the at least one pipeline and configured to store the cooling fluid, wherein the storage tank is disposed between the pump and the second radiator.

8. The projection device according to claim 6, wherein the plurality of heat sources comprise at least one first heat source and at least one second heat source, the at least one first heat source is thermally coupled to the at least one first liquid cold plate, and the at least one second heat source is thermally coupled to the at least one second liquid cold plate, wherein a first working temperature of the first heat source is less than a second working temperature of the second heat source.

9. The projection device according to claim 6, further comprising at least one second fan is disposed beside the second radiator.

10. The projection device according to claim 6, further comprising a projection lens, and the projection lens is disposed on the first sidewall, wherein the at least one main air inlet is a plurality of main air inlets, the plurality of main air inlets comprise a first main air inlet and a second main air inlet, the first main air inlet is disposed on the second sidewall, the second main air inlet is disposed on the fourth sidewall.

11. The projection device according to claim 6, further comprising a projection lens, and the projection lens is disposed on the first sidewall, wherein the at least one main air inlet is a plurality of main air inlets, and the plurality of main air inlets comprise a first main air inlet and a second main air inlet, the first main air inlet is disposed on the first sidewall, the second main air inlet is disposed on the second sidewall or the fourth sidewall.

12. The projection device according to claim 6, wherein the plurality of heat sources comprise a light-emitting element and a light valve in the projection device.

* * * * *